(12) United States Patent
Timoshkov et al.

(10) Patent No.: US 9,329,503 B2
(45) Date of Patent: May 3, 2016

(54) MULTILAYER MIRROR

(75) Inventors: Vadim Iourievich Timoshkov, Veldhoven (NL); Jan Bernard Plechelmus van Schoot, Eindhoven (NL); Antonius Theodorus Wilhelmus Kempen, 's-Hertogenbosch (NL); Andrei Mikhailovich Yakunin, Eindhoven (NL); Edgar Alberto Osorio Oliveros, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 669 days.

(21) Appl. No.: 13/698,171

(22) PCT Filed: Apr. 6, 2011

(86) PCT No.: PCT/EP2011/055360
§ 371 (c)(1),
(2), (4) Date: Nov. 15, 2012

(87) PCT Pub. No.: WO2011/147628
PCT Pub. Date: Dec. 1, 2011

(65) Prior Publication Data
US 2013/0057840 A1  Mar. 7, 2013

Related U.S. Application Data

(60) Provisional application No. 61/348,999, filed on May 27, 2010.

(51) Int. Cl.
*G03B 27/70* (2006.01)
*G03F 7/20* (2006.01)
(Continued)

(52) U.S. Cl.
CPC ............ *G03F 7/70958* (2013.01); *B82Y 10/00* (2013.01); *C23C 14/48* (2013.01); *C23C 14/586* (2013.01); *G21K 1/062* (2013.01)

(58) Field of Classification Search
CPC . G03F 7/70925; G03F 7/70958; G21K 1/062; G21K 2201/067; C23C 14/48; C23C 14/586
See application file for complete search history.

(56) References Cited

U.S. PATENT DOCUMENTS 6,160,867 A    12/2000  Murakami
6,231,930 B1    5/2001  Klebanoff
(Continued)

FOREIGN PATENT DOCUMENTS

EP    1 515 188 A1    3/2005
JP    2009-510714 A   3/2009
(Continued)

OTHER PUBLICATIONS

International Search Report directed to related International Patent Application No. PCT/EP2011/055360, mailed Sep. 30, 2011, from the European Patent Office; 3 pages.
(Continued)

*Primary Examiner* — Deoram Persaud
(74) *Attorney, Agent, or Firm* — Sterne, Kessler, Goldstein & Fox P.L.L.C.

(57) ABSTRACT

There is provided a multilayer mirror (80) comprising a layer of a first material (84) and a layer of silicon (82). The layer of the first material and the layer of silicon form a stack of layers. An exposed region of the layer of silicon comprises a modification that is arranged to improve the robustness of the exposed region of silicon.

16 Claims, 6 Drawing Sheets

(51) Int. Cl.
*B82Y 10/00* (2011.01)
*C23C 14/48* (2006.01)
*C23C 14/58* (2006.01)
*G21K 1/06* (2006.01)

(56) References Cited

U.S. PATENT DOCUMENTS

| | | |
|---|---|---|
| 7,750,326 B2 | 7/2010 | Van Herpen et al. |
| 8,681,313 B2 | 3/2014 | Vladimirsky et al. |
| 2003/0162005 A1 | 8/2003 | Shoki |
| 2005/0238963 A1 | 10/2005 | Ishibashi et al. |
| 2008/0149854 A1 | 6/2008 | Van Herpen et al. |
| 2013/0278912 A1* | 10/2013 | Owa et al. .............. G02B 26/06 355/71 |

FOREIGN PATENT DOCUMENTS

| | | |
|---|---|---|
| JP | 2011-517126 A | 5/2011 |
| WO | WO 2010/034385 A1 | 4/2010 |

OTHER PUBLICATIONS

International Preliminary Report on Patentability and Written Opinion of the International Searching Authority directed to related International Patent Application No. PCT/EP2011/055360, mailed Nov. 27, 2012, from the International Bureau of WIPO; 7 pages.

Dobrovolskiy, S., et al., "Formation of Si/SiC multilayers by low-energy ion implantation and thermal annealing," Nuclear Instruments and Methods in Physics Research B: Beam Interactions with Materials and Atoms, vol. 268, No. 6, 2010; pp. 560-567.

Lassiter, M. G., et al., "Inhibiting spontaneous etching of nanoscale electron beam induced etching features: Solutions for nanoscale repair of extreme ultraviolet lithography masks," Journal of Vacuum Science and Technology B, vol. 26, No. 3, May-Jun. 2008; pp. 963-967.

Prisbrey, S. T., et al., "Iridium/silicon capping layer for soft x-ray and extreme ultraviolet mirrors," Journal of Vaccum Science and Technology B, vol. 23, No. 6, Nov.-Dec. 2005; pp. 2378-2383.

* cited by examiner

MULTILAYER MIRROR

CROSS-REFERENCE TO RELATED APPLICATIONS

This application claims the benefit of U.S. provisional application 61/348,999, which was filed on May 27, 2010, and which is incorporated herein in its entirety by reference.

FIELD

The present invention relates to a multilayer mirror, for example a multilayer mirror suitable for use in a lithographic apparatus, such as an EUV lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing (i.e., pattern application) can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print (i.e., apply) the pattern, $k_1$ is a process dependent adjustment factor, also called the Rayleigh constant, and CD is the feature size (or critical dimension) of the printed (i.e., applied) feature. It follows from equation (1) that reduction of the minimum printable (i.e., applicable) size of features can be obtained in three ways: by shortening the exposure wavelength $\lambda$, by increasing the numerical aperture NA or by decreasing the value of $k_1$.

In order to shorten the exposure wavelength and, thus, reduce the minimum printable (i.e., applicable) feature size, it has been proposed to use an extreme ultraviolet (EUV) radiation source. EUV radiation is electromagnetic radiation having a wavelength within the range of 5-20 nm, for example within the range of 13-14 nm, or example within the range of 5-10 nm such as 6.7 nm or 6.8 nm. Possible sources include, for example, laser-produced plasma (LPP) sources, discharge plasma (DPP) sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g., tin), or a stream of a suitable gas or vapour, such as Xe gas or Li vapour. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

Practical EUV Sources, such those which generate EUV radiation using a plasma, do not only emit desired 'in-band' EUV radiation, but also undesirable 'out-of-band' radiation. This out-of-band radiation is most notably in the deep ultra violet (DUV) radiation range (100-400 nm). Moreover, in the case of some EUV sources, for example laser produced plasma EUV sources, the radiation from the laser, usually at 10.6 μm, presents a significant amount of out-of-band radiation.

In a lithographic apparatus, spectral purity is required for several reasons. One reason is that resist is sensitive to out-of-band wavelengths of radiation, and thus the image quality of patterns applied to the resist may be deteriorated if the resist is exposed to such out-of-band radiation. Furthermore, out-of-band radiation infrared radiation, for example the 10.6 μm radiation in some laser produced plasma sources, leads to unwanted and unnecessary heating of the patterning device, substrate, and optics within the lithographic apparatus. Such heating may lead to damage of these elements, degradation in their lifetime, and/or defects or distortions in patterns projected onto and applied to a resist-coated substrate.

One way of preventing out-of-band radiation from propagating through the lithographic apparatus is to filter, or apply a filter to, radiation generated by the radiation source. The filter may be transmissive, reflective, diffractive, refractive, or the like. For instance, in one example a multilayer mirror may be provided which reflects, or preferentially reflects, EUV radiation, while at the same time suppressing in some way (e.g., by absorption, destructive interference, reflection in a different direction) the reflection of infrared radiation in the same direction as the EUV radiation. The multilayer mirror may alternatively or additionally comprise or form part of a grating structure. The grating structure may be configured to ensure that EUV radiation is reflected from the multilayer mirror at a first angle, and so that infrared radiation is reflected from the multilayer at a second, different angle. By reflecting the EUV radiation and infrared radiation at different angles, the EUV radiation may be directed through the lithographic apparatus, whereas the infrared radiation may be directed towards a beam dump or the like. Such a grating structure may be located in a radiation source of a lithographic apparatus, for example. However, a multilayer mirror, with or without such a grating structure, may find use throughout a lithographic apparatus, for example as one or more optical elements of the lithographic apparatus for use in manipulating (e.g., reflecting, shaping, or the like) a radiation beam used in the lithographic apparatus.

A problem associated with the use of multilayer mirrors in a lithographic apparatus is the degradation of the multilayer mirrors over time. Harsh conditions within a lithographic apparatus can result in, for example, degradation of one or more silicon layers which may form a part of such a multilayer mirror. For instance, due to the high temperatures in a lithographic apparatus or a radiation source forming a part of or being in connection with the lithographic apparatus, and/or the generation of high energy particulate contamination, one or more layers of silicon may be subjected to sputtering or general degradation during use. Alternatively or additionally, it has been proposed to use hydrogen gas (either in molecular form or atomic form) in an EUV lithographic apparatus as a debris suppressant or contamination barrier, or for use in cleaning optical elements. However, silicon, which often constitutes one or more layers of a multilayer mirror, can react with hydrogen, causing degradation of the silicon layers.

SUMMARY

It is an aim of the present invention to provide a multilayer mirror, or a method of modifying a multilayer mirror, which obviates or mitigates one or more problems of the prior art, whether identified herein or elsewhere, or which provides an alternative to an existing multilayer mirror or method of modifying such a multilayer mirror. An aim of the present invention may be to improve the robustness of a multilayer mirror, for example to protect one or more silicon layers of a multilayer mirror from reaction with hydrogen, or from sputtering.

According to a first aspect of the present invention, there is provided a multilayer mirror comprising: a layer of a first material; a layer of silicon; the layer of the first material and the layer of silicon forming a stack of layers; wherein an exposed region of the layer of silicon comprises a modification that is arranged to improve the robustness of the exposed region of silicon.

The modification may be arranged to improve the robustness of the exposed region of silicon by one or both of: reducing a reactivity of the exposed region of the layer of silicon with hydrogen or atomic hydrogen; and/or improving a sputtering resistance of the exposed region of the layer of silicon.

The modification may comprise one or more of: one or more implanted materials provided on a surface of the exposed region of the layer of silicon, or within the exposed region of the layer of silicon; and/or a passivation layer covering, or forming part of, the exposed region of the layer of silicon.

The one or more implanted materials may comprise one or more of: boron, nitrogen, and/or a nitride.

The passivation layer may comprise one or more of: a nitride layer, a silicon nitride layer, a boron glass layer (e.g., boron-silicon glass, or borosilicate glass) or a silicon oxynitride layer.

The exposed region of the layer of silicon may be a peripheral region of the layer of silicon and/or a sidewall of the layer of silicon.

An unexposed region of the layer of silicon may be absent of a modification.

The unexposed region of the layer of silicon may comprise at least a centre or central region of the layer of silicon.

The multilayer mirror may comprise a plurality of layers of the first material and/or a plurality of layers of silicon, and the layers of silicon may be separated by a layer of the first material, and/or the layers of the first material may be separated by a layer of silicon.

A plurality of the layers of silicon may have an exposed region, each exposed region comprising the modification.

A plurality of exposed regions of the layer or layers of silicon may comprise the modification.

A majority, or substantially all, of the exposed region or regions of the layer or layers of silicon may comprise the modification.

The first material may comprise molybdenum.

The multilayer mirror may be configured to reflect, or to preferentially reflect, EUV radiation.

The multilayer mirror may be configured to suppress the reflection of infrared radiation.

The multilayer mirror may be arranged to reflect EUV radiation in a first direction, and to reflect infrared radiation in a second, different direction.

The multilayer mirror may comprise, or form a part of, a grating structure.

To protect the multilayer mirror from hydrogen particles, the multilayer mirror may be provided with protective layer on the stack of layers. Such a protective layer may comprise silicon nitride, ruthenium or molybdenum.

According to a second aspect of the present invention, there is provided a lithographic apparatus or a radiation source provided with the multilayer mirror according to a first aspect of the present invention. The second aspect of the invention may have, where appropriate, any one or more additional or alternative features described in relation to the first aspect of the invention.

According to a third aspect of the present invention, there is provided a method of improving the robustness of a multilayer mirror, the multilayer mirror comprising: a layer of a first material; a layer of silicon; the layer of the first material and the layer of silicon forming a stack of layers; the method comprising: modifying an exposed region of the layer of silicon to improve the robustness of the exposed region of silicon.

The modifying may improve the robustness of the exposed region of silicon by one or both of: reducing a reactivity of the exposed region of the layer of silicon with hydrogen or atomic hydrogen; and/or improving a sputtering resistance of the exposed region of the layer of silicon.

The modifying may comprise one or more of: implanting one or more material on a surface of the exposed region of the layer of silicon, or within the exposed region of the layer of silicon; and/or providing a passivation layer that covers, or forms part of, the exposed region of the layer of silicon.

The third aspect of the invention may have, where appropriate, any one or more additional or alternative features described in relation to the first or second aspects of the invention.

According to a fourth aspect of the present invention, there is provided a multilayer mirror formed using the method of the third aspect of the present invention.

The fourth aspect of the invention may have, where appropriate, any one or more additional or alternative features described in relation to the first, second or third aspects of the invention.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention FIG. 1 schematically depicts a lithographic apparatus according to an embodiment of the invention.

Figure 4:
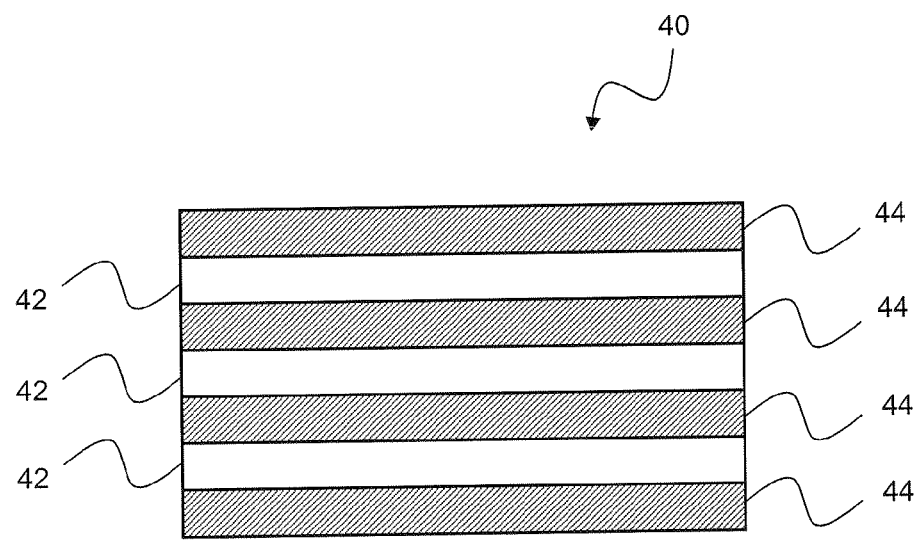

FIG. 4 schematically depicts an existing multilayer mirror in a side-on view.

Figure 5:
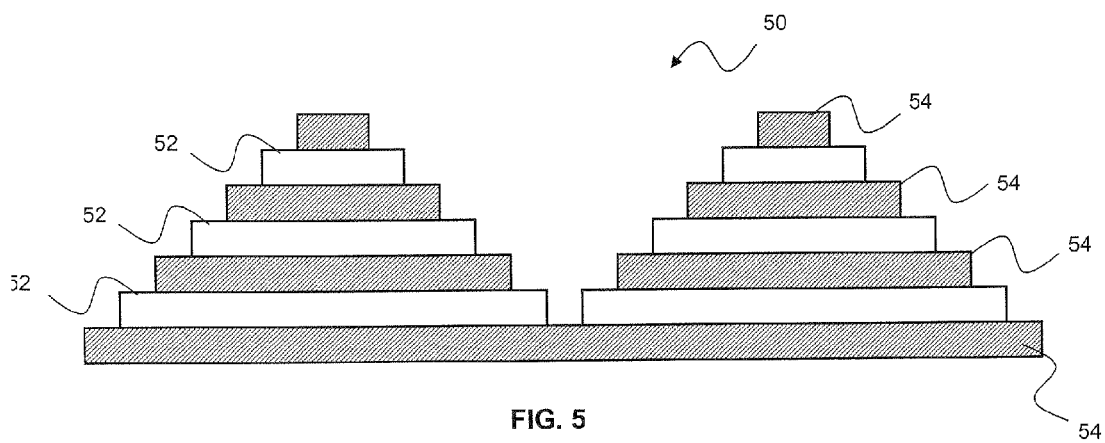
Figure 6:
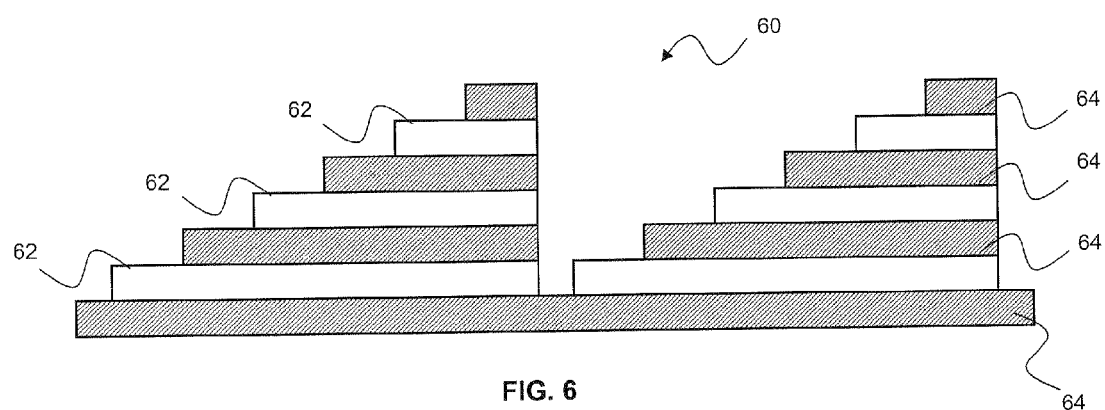
Figure 7:
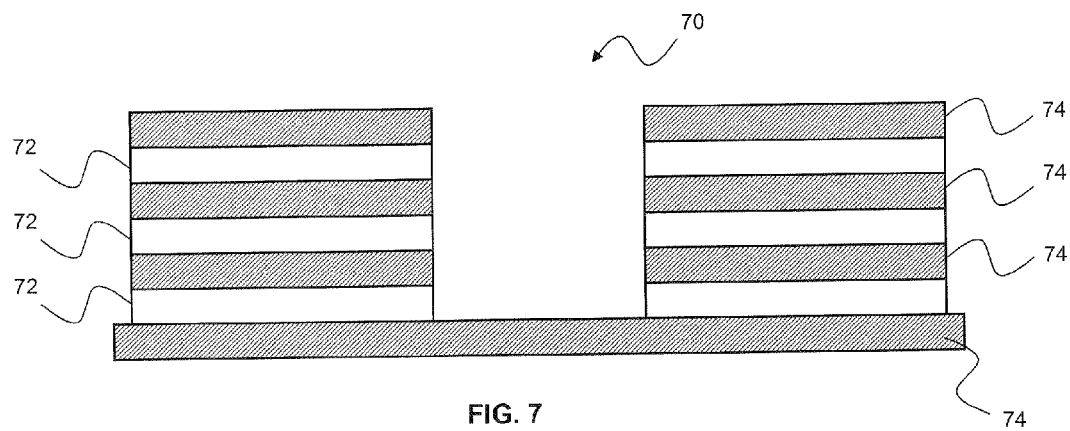

FIGS. 5 to 7 schematically depict known multilayer mirror grating structures in side on views.

Figure 8:
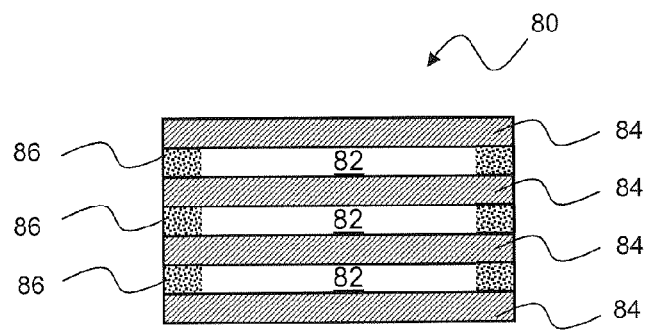

FIG. 8 schematically depicts a multilayer mirror, comprising a modification, in accordance with an embodiment of the present invention.

Figure 9:
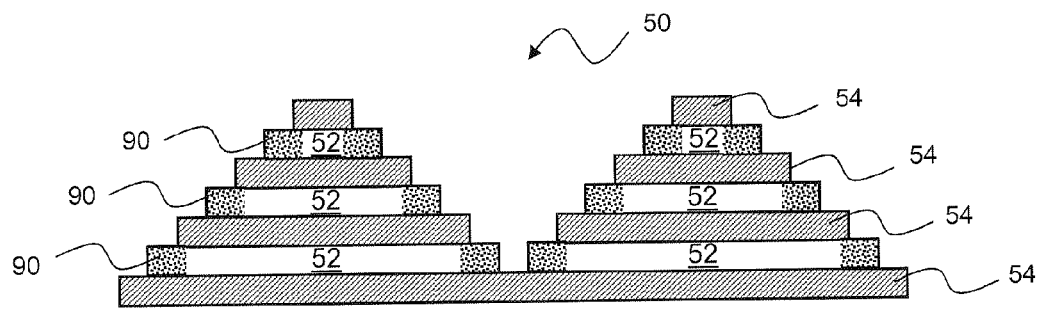
Figure 10:
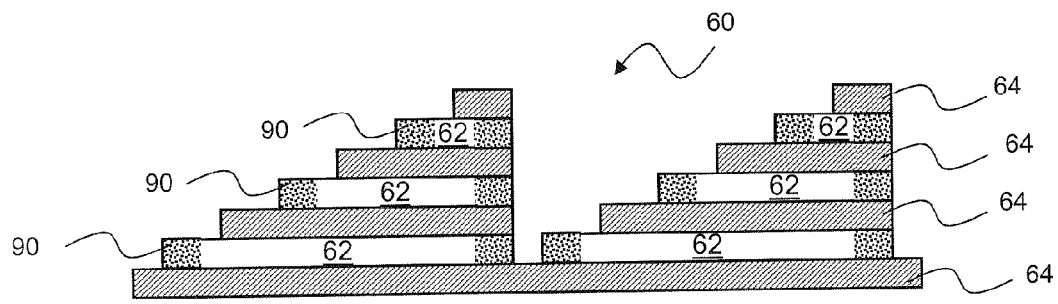
Figure 11:
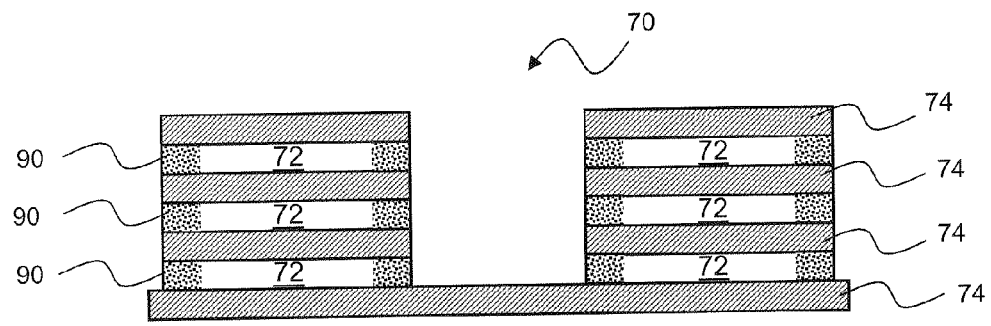

FIGS. 9 to 11 schematically depict multilayer mirror grating structures, comprising modifications, in accordance with an embodiment of the present invention.

FIGS. 12 to 15 schematically depict a method for modifying a multilayer mirror having or forming a grating structure, in accordance with an embodiment of the present invention.

Figure 16:
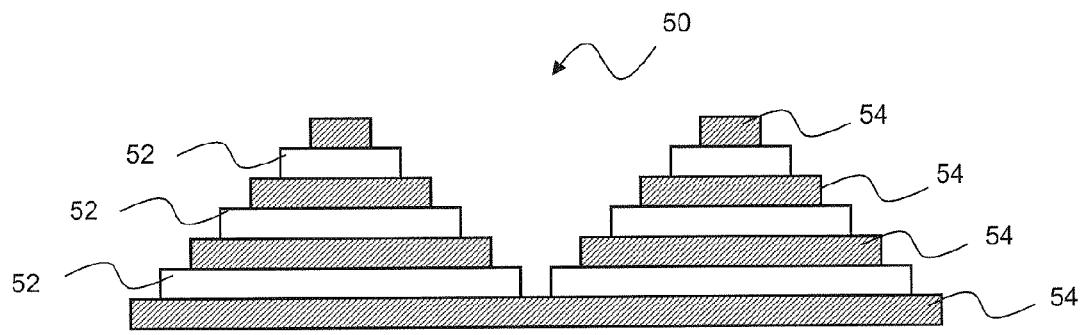
Figure 17:
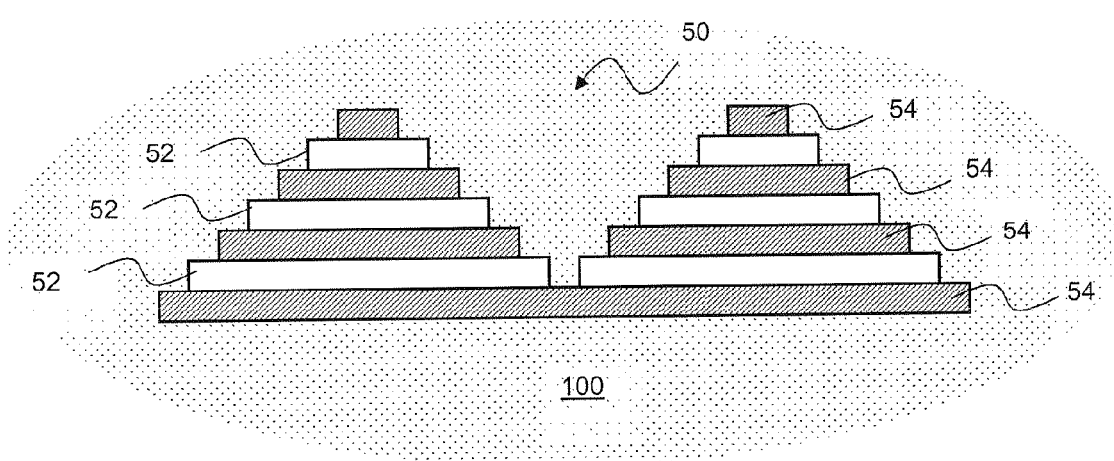
Figure 18:
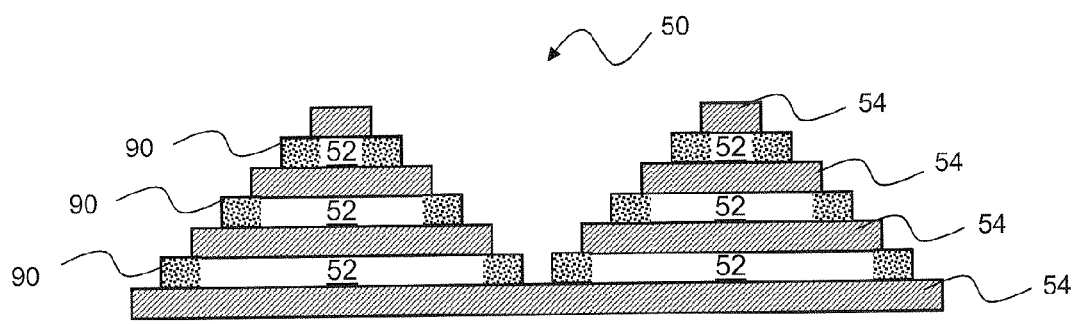

FIGS. 16 to 18 schematically depict another method for modifying a multilayer mirror having or forming a grating structure, in accordance with an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
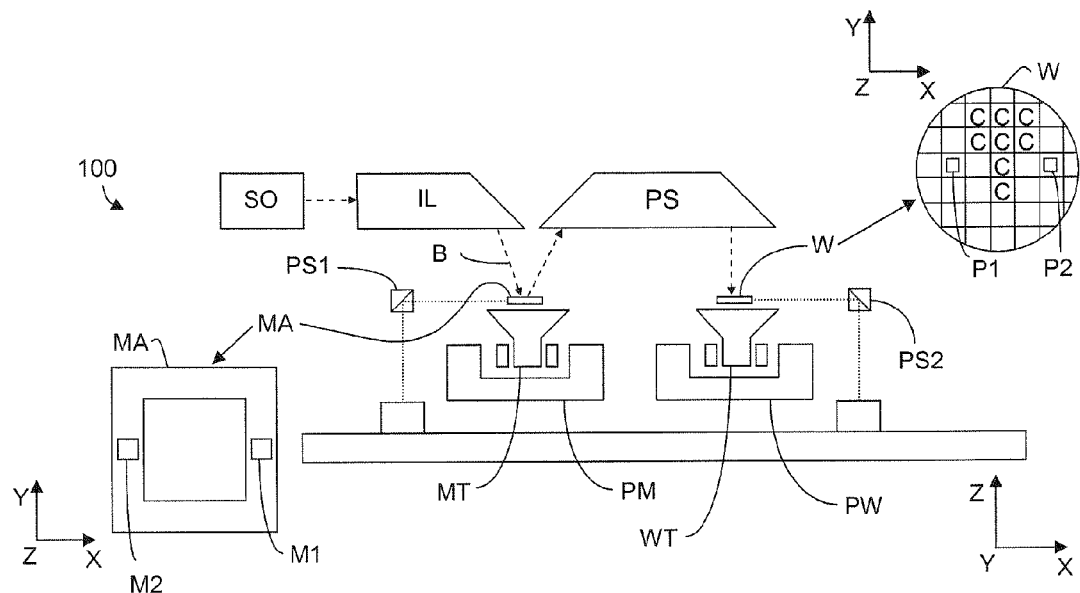

FIG. 1 schematically depicts a lithographic apparatus 100 including a source collector module SO according to one embodiment of the invention. The apparatus comprises an illumination system (sometimes referred to as an illuminator) IL configured to condition a radiation beam B (e.g., EUV radiation), a support structure (e.g., a mask table) MT constructed to support a patterning device (e.g., a mask or a reticle) MA and connected to a first positioner PM configured to accurately position the patterning device MA, a substrate table (e.g., a wafer table) WT constructed to hold a substrate (e.g., a resist-coated wafer) W and connected to a second positioner PW configured to accurately position the substrate W, and a projection system (e.g., a reflective projection system) PS configured to project a pattern imparted to the radiation beam B by patterning device MA onto a target portion C (e.g., comprising one or more dies) of the substrate W.

The illumination system IL may include various types of optical components, such as refractive, reflective, magnetic, electromagnetic, electrostatic, or other types of optical components, or any combination thereof, for directing, shaping, or controlling radiation.

The support structure MT holds the patterning device MA in a manner that depends on the orientation of the patterning device MA, the design of the lithographic apparatus 100, and other conditions, such as for example whether or not the patterning device MA is held in a vacuum environment. The support structure MT can use mechanical, vacuum, electrostatic, or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic, or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illumination system IL receives an extreme ultra violet (EUV) radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma (LPP), the required plasma can be produced by irradiating a fuel, such as a droplet, stream, or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illumination system IL may comprise an adjuster for adjusting the angular intensity distribution of the radiation beam B. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as facetted field and pupil mirror devices. The illumination system may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously (e.g., in the X or Y direction) while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
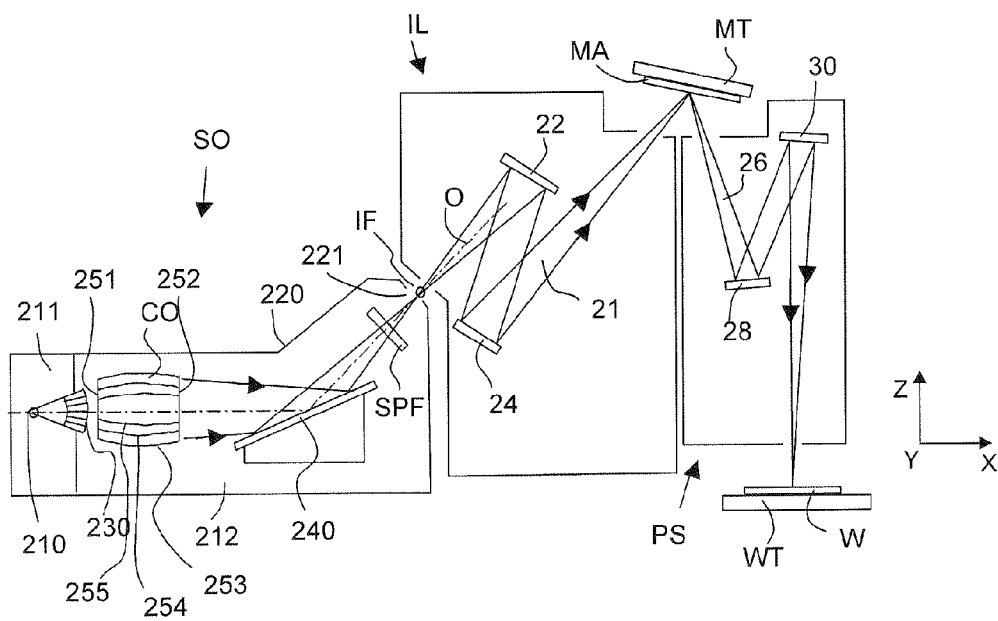
FIG. 2 is a more detailed view of the lithographic apparatus shown in FIG. 1, including a discharge produced plasma (DPP) source collector module SO.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma (DPP) source. EUV radiation may be produced by a gas or vapor, for example Xe gas, Li vapor, or Sn vapor in which the (very hot) plasma 210 is created to emit radiation in the EUV range of the electromagnetic spectrum. The (very hot) plasma 210 is created by, for example, an electrical discharge creating an at least partially ionized plasma. Partial pressures of, for example, 10 Pa of Xe, Li, Sn vapour or any other suitable gas or vapour may be required for efficient generation of the radiation. In an embodiment, a plasma of excited tin (Sn) is provided to produce EUV radiation.

The radiation emitted by the plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252.

Radiation that traverses collector CO can be reflected off a grating spectral filter 240 to be focused in a virtual source point IF. The virtual source point IF is commonly referred to as the intermediate focus, and the source collector module SO is arranged such that the intermediate focus IF is located at or near an opening 221 in the enclosing structure 220. The virtual source point IF is an image of the radiation emitting plasma 210. Before passing through the opening 221, the radiation may pass through an optional spectral purity filter SPF. In other embodiments, the spectral purity filter SPF may be located in a different part of the lithographic apparatus (e.g., outside of the source collector module SO).

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more reflective elements (e.g., mirrors or the like) present than those shown in the Figures, for example there may be 1-6 additional reflective elements present in the projection system PS than shown in FIG. 2.

Collector CO, as illustrated in FIG. 2, is depicted as a nested collector with grazing incidence reflectors 253, 254 and 255, just as an example of a collector (or collector mirror). The grazing incidence reflectors 253, 254, and 255 are disposed axially symmetric around an optical axis O and a collector CO of this type is preferably used in combination with a discharge produced plasma source, often called a DPP source.

Figure 3:
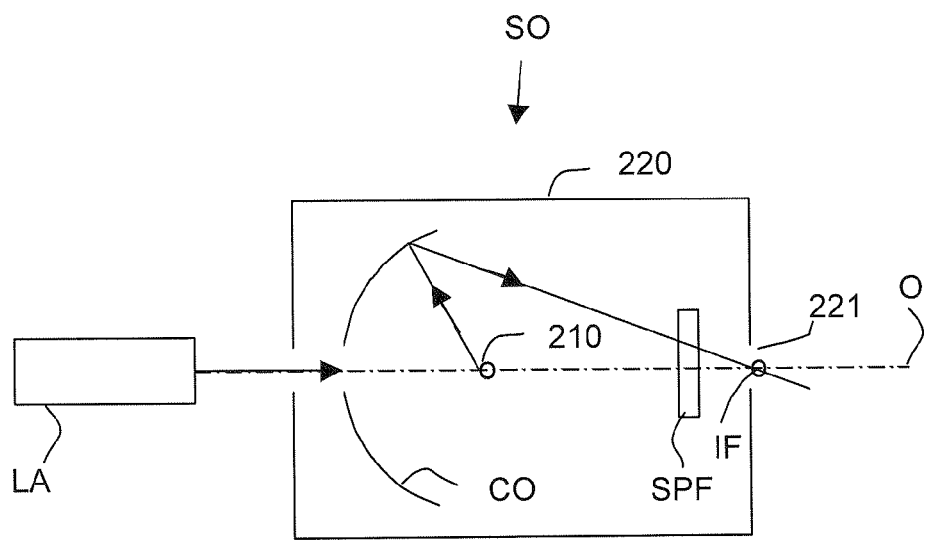
FIG. 3 is a view of an alternative source collector module SO of the apparatus of FIG. 1, the alternative being a laser produced plasma (LPP) source collector module.

Alternatively, the source collector module SO may be part of, comprise or form an LPP radiation system as shown in FIG. 3. Referring to FIG. 3, a laser LA is arranged to deposit laser energy into a fuel, such as a droplet or region or vapour of xenon (Xe), tin (Sn) or lithium (Li), creating the highly ionized plasma 210 with electron temperatures of several 10's of eV. The energetic radiation generated during de-excitation and recombination of these ions is emitted from the plasma 210, collected by a near normal incidence collector CO and focused onto the opening 221 in the enclosing structure 220. Before passing through the opening 221, the radiation may pass through an optional spectral purity filter SPF. In other embodiments, the spectral purity filter SPF may be located in a different part of the lithographic apparatus (e.g., outside of the source collector module SO).

The apparatus shown in and described with reference to FIGS. 1 to 3 may comprise, for example additionally or alternatively, a grating filter. As known in the art, a grating filter may be used to filter, for example, EUV radiation from infrared radiation. For example, the grating may be configured to ensure that EUV radiation is directed in a first direction, and infrared radiation is directed in a second, different direction. Because the first and second directions are different, a filter effect is achieved, which may facilitate the prevention or suppression of infrared radiation passing through the apparatus. The grating filter may comprise or be a multilayer mirror structure.

Alternatively or additionally, one or more optical elements of the described apparatus may be or comprises one or more multilayer mirrors. The multilayer mirrors may be configured to specifically reflect, or preferentially reflect a certain wavelength (or range of wavelengths) of radiation, for example EUV radiation. Such preferential or specific reflection can be used, alternatively or additionally, as a filter, for example by the multilayer mirror not reflecting other wavelengths of radiation, such as infrared radiation.

FIG. 4 schematically depicts a known multilayer mirror 40. The multilayer mirror 40 comprises of a stack of layers, alternating between layers of silicon 42 and layers of a first, different material (usually, but not exclusively molybdenum 44).

FIGS. 5 to 7 each schematically depict multilayer mirrors comprising, or forming part of a grating structure. In FIG. 5, the multilayer mirror grating structure 50 again comprises a stack of layers comprising alternating layers of silicon 52 and a first material 54 (e.g., molybdenum). In this embodiment, the stacks of layers form pyramid-like structures. In FIG. 6, the multilayer mirror grating structure 60 again comprises a stack of layers comprising alternating layers of silicon 62 and a first material 64 (e.g., molybdenum). In this Figure, the multilayer stacks form triangular-like structures. In FIG. 7, the multilayer mirror grating structure 70 again comprises a stack of layers comprising alternating layers of silicon 72 and a first material 74 (e.g., molybdenum). In this embodiment, the multilayer stacks form substantially cuboid-like structures, and for example repeat the structure shown in FIG. 4.

The grating structures shown in and described with reference to FIGS. 5 to 7 can be formed by appropriate removal of material from a multilayer mirror having a structure similar or identical to that shown in FIG. 4. Material may be removed using a diamond tip or the like. Material can be appropriately removed to form a grating structure having pyramid-like features, triangular-like features, or cuboid-like features that are shaped and/or spaced to provide certain functionality. For example, that functionality might include the reflection of EUV radiation in a first direction, and the reflection of infrared radiation in a second, different direction, so that the grating can be used as, or form part of, a filter arrangement, preventing infrared radiation from passing through the lithographic apparatus.

From a review of FIGS. 4 to 7, it will be appreciated that there is no encapsulation or the like of the multilayer mirror, or the layers of material which form the multilayer mirror. For instance, it can be seen that in all examples of the multilayer mirrors shown in FIGS. 4 to 7, every layer of silicon comprises an exposed region. This exposed region is a region which is not covered by or enclosed by the first material (e.g., molybdenum), and which is thus exposed to the environment in which the multilayer mirror is located. The exposed region may thus be a peripheral part or region of the silicon layer, and/or for example a side-wall of the layer or the like. Because the silicon layer comprises regions which are exposed, those exposed regions may be more likely to suffer degradation during use. Degradation may be caused due to sputtering (or in other words etching) of that region due to the often harsh conditions in which the multilayer mirror may be used. Such harsh conditions may include high temperatures, or bombardment with high energy particles, or exposure to molecular or atomic hydrogen. The degradation may reduce the lifetime of the multilayer mirror as a whole, and/or negatively affect the optical performance of the multilayer mirror, and thus the lithographic apparatus as a whole. It is desirable to overcome one or more of these problems.

According to an embodiment of the present invention, one or more problems or disadvantages associated with known multilayer mirror structures may be obviated or mitigated. According to an embodiment of the present invention, there is provided a multilayer mirror. The multilayer mirror comprises at least a layer of a first material (e.g., molybdenum), and at least a layer of silicon. As with known multilayer mirror structures, the layer of the first material, and the layer of silicon together form a stack of layers. In contrast with known multilayer mirror structures, an exposed region of the layer of silicon comprises a modification that is arranged to improve the robustness of the exposed region of silicon, and thus the robustness of the multilayer mirror as a whole. The modification may be arranged to improve the robustness of the exposed region of silicon by one or both of: reducing a reactivity of the exposed region of the exposed layer of silicon with hydrogen or atomic hydrogen; and/or improving a sputtering (in other words, etching) resistance of the exposed region of the layer of silicon. It is likely that the modification that is arranged to improve the robustness of the exposed region of silicon will both reduce reactivity with hydrogen and also improves the sputtering resistance.

The modification may comprise of one or more implanted materials provided on a surface of the exposed region of the layer of silicon, or within the exposed region of the layer of silicon, and/or a passivation layer covering, or forming part of, the exposed region or the layer of silicon.

An exposed region of silicon is a region of silicon which is not enclosed or covered by the first material, and which is thus exposed to the environment in which the multilayer mirror is present. 'Exposed' may be interpreted broadly, and encompasses silicon that is exposed before the modification is undertaken or implemented, and which is not exposed after the modification. Regions which are covered or enclosed by the layer of the first material (or by other material) may be deemed as being 'unexposed'.

FIGS. 8 to 18 will now be used to describe non-limiting embodiments of the present invention. Like features are given the same reference numerals, where appropriate, for clarity and consistency. The Figures are not drawn to any particular scale, unless explicitly stated otherwise.

FIG. 8 schematically depicts a multilayer mirror structure 80 according to an embodiment of the present invention. The multilayer mirror structure 80 comprises a stack of alternating layers of silicon 82 and a first material 84 (e.g., molybdenum, due to its good optical conductivity).

In accordance with an embodiment of the invention, regions of the silicon layers 82 that would otherwise have been exposed to the environment in which the multilayer mirror structure 80 was located have been modified 86 to improve the robustness of the exposed region of the silicon layers 82. The modification 86 may be provided in any manner, for example by implantation of one or more materials in or on the exposed region, or by the formation of a passivation layer on a surface of or within the exposed region. Examples of such methods will be described in more detail below.

Instead of modifying individual exposed regions at a time, it is likely that the method of modifying will be such that a plurality, most or all exposed regions of all layers of silicon will be modified substantially at the same time and in the same process or method. This is shown in FIG. 8, where all exposed regions have been modified 86, and for example at substantially the same time.

Due to the nature of a stack of layers, it is likely that exposed regions of the silicon layer 82 will be at or comprise a periphery of that layer and/or a side-wall of that layer of silicon 82. A central region or centre of each layer of silicon 82 will not or may not comprise such a modification (e.g., an unexposed region of the layer of silicon 82 may be absent of a modification). This may be useful, or in some embodiments necessary to ensure that the optical properties of the multilayer mirror are not affected, or substantially affected, by the presence of the modification 86.

FIGS. 9, 10 and 11 show exemplary multilayer mirror grating structures 50, 60, 70, and correspond substantially to those shown in and described with reference to Figurers 5 to 7. A difference with the grating structures 50, 60, 70 shown in FIGS. 9, 10 and 11 respectively, is that exposed regions silicon layers 52, 62, 72 have been modified 90, as discussed above, to improve the robustness of the exposed region of the layer of silicon 52, 62, 72.

In one example, the modification of the exposed region or regions of silicon may involve the implantation of materials on a surface of the exposed region, or within the exposed region. For instance, the implantation may comprise the use of one or more implanted materials such as boron, nitrogen, and/or a nitride. Alternatively or additionally, the modification may comprise or involve the formation of a passivation layer covering the exposed region of silicon, or forming part of the exposed region of silicon. The passivation layer may be, for example, one or more of a nitride layer, a silicon nitride layer, a boron glass layer, or a silicon oxynitride layer. A passivation layer, for example, may be formed by exposure of the exposed region of silicon to a certain gas or a gaseous mixture.

It has been found that appropriate implantation, and/or the formation of a passivation layer can reduce the reactivity of silicon with hydrogen, thus reducing the etching of the silicon by the hydrogen, and/or can make the silicon more resistant to sputtering.

In one example, an etching mechanism of silicon by atomic hydrogen consists of the generation of multiple hydride phases ($SiH$, $SiH_2$, and $SiH_3$) which diffuse on the surface until silane ($SiH_4$) as the main etching product is formed and dissolves from the surface. It has been found that the formation of silane is largely reduced when silicon is, for example, boron-doped (e.g., by implantation of the silicon with boron). The presence of boron promotes the formation of highly stable hydrocarbon particles ($BH_3$) on the surface, which hinders the generation of silane. It has been found that the etching rate of silicon by atomic hydrogen could be reduced by as much as a factor of 5 by implantation of exposed regions of silicon with boron.

In another example, immersing the multilayer mirror in a nitrogen and ammonia gas ($NH_4$) could be used to form a nitride layer on the surface of the exposed region of silicon. Also, silane ($SiH_4$) gas generated from a reaction between hydrogen and silicon reacts with the nitrogen or the ammonia and forms a silicon nitride layer. Silicon nitride is known for its hardness and chemical resistivity to a highly reactive hydrogen environment (e.g., comprising hydrogen radicals/atomic hydrogen). Also, hard materials such as silicon nitride or a nitride layer will increase the sputtering resistance of the exposed region of silicon. A gas comprising boron could alternatively or additionally be used to form a boron glass (e.g., boron-silicon glass, or borosilicate glass) layer on, or forming part of, the exposed region of silicon. All these layers may be termed 'passivation layers' due to the fact that they reduce a reactivity of the silicon with respect to hydrogen and/or increase the sputtering resistance of the exposed region of silicon.

FIGS. 12 to 18 schematically depict exemplary methods for providing the above-mentioned modification of exposed regions of silicon. FIGS. 12 to 15 show an implantation (under an angle) method, and FIGS. 16 to 18 depict a method in which a multilayer mirror is exposed to an appropriate gaseous environment.

Figure 12:
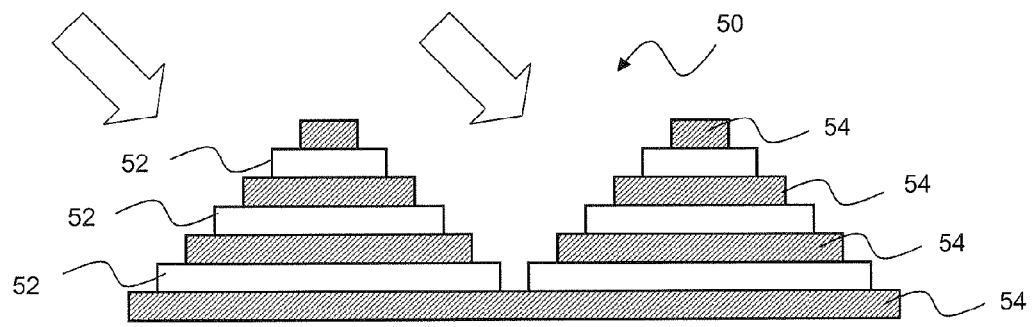
Figure 13:
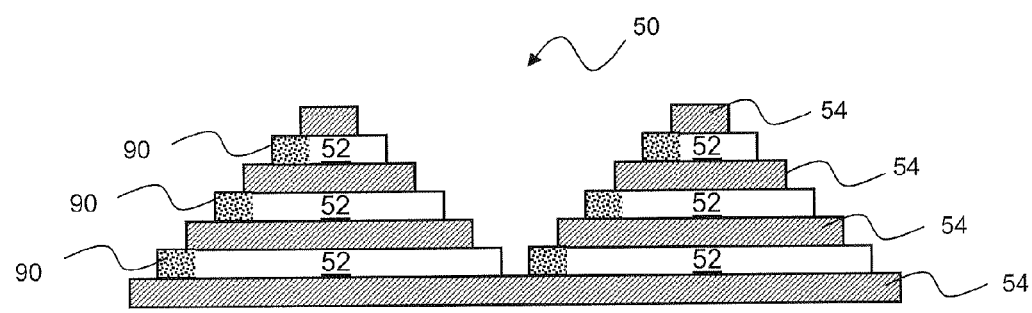
Figure 14:
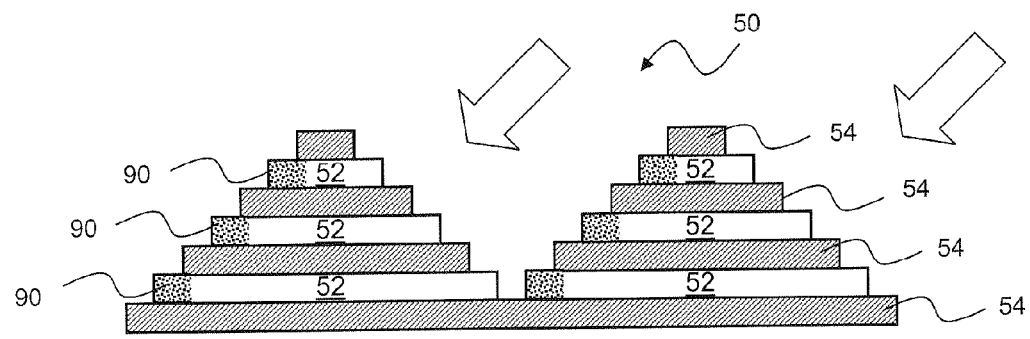
Figure 15:
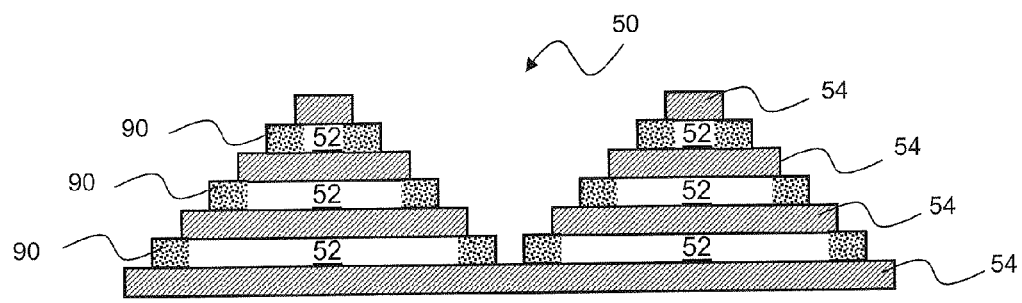

FIG. 12 schematically depicts the multilayer mirror grating structure 50 shown in and described with reference to FIG. 5, although the described method is of course applicable to any multilayer mirror structure. Implantation of exposed regions of layers of silicon 52 is shown as being undertaken at a first angle in FIG. 12. FIG. 13 shows that such implantation results in the modification of exposed regions of modification 90 of the exposed regions of silicon on one side of the multilayer mirror structure 50. FIG. 14 shows that implantation is then undertaken at a second, substantially opposite angle. FIG. 15 shows that the result of this second implantation is that the exposed regions of silicon on an opposite side of the multilayer mirror structure 50 are appropriately modified 90.

FIG. 16 again shows the multilayer mirror grating structure shown in and described with reference to FIG. 5, although the described method is applicable to any multilayer mirror structure. FIG. 17 shows the location of the multilayer mirror structure 50 in a gaseous environment 100. The gaseous environment is specifically chosen to ensure that the exposed regions of the layers of silicon 52 are appropriately modified to improve their robustness, for example with respect to sputtering or reaction with atomic hydrogen. FIG. 18 shows the resultant multilayer mirror grating structure 50, now including the modifications 90 of the exposed regions of silicon due to their exposure to the gas 100 in FIG. 17.

The skilled person will understand that the methods and materials for modifying an exposed region of silicon to improve its robustness have been given my way of example only. The examples are not exhaustive. The skilled person, when reading the description of the invention, might be aware of other materials and methods that may be used to improve the robustness of the silicon. These materials and methods fall within the scope of the invention as claimed.

Any multilayer mirror described herein may, as discussed above, be configured to reflect, or to preferentially reflect or select EUV radiation. Alternatively or additionally, a multilayer mirror may be configured to suppress the reflection of, for example, infrared radiation. Alternatively or additionally, a multilayer mirror may be arranged to reflect EUV radiation in a first direction, and to reflect infrared radiation in a second, different direction. Such a multilayer mirror may comprise or form part of a grating structure. The dimensions of the layers of the multilayer mirror, and/or compositions of those layers, required to achieve such reflection or suppression are known in the art, are not the focus of the present invention, and will thus not be described in detail here.

In some embodiments, the multilayer mirror may be made, sold, and/or used, or the like, in isolation. However, it is likely that the multilayer mirror may find particular use in a lithographic apparatus, or a radiation source, as described above. For instance, the multilayer mirror may find use with a lithographic apparatus comprising an illumination system configured to condition a radiation beam. The apparatus may alternatively or additionally comprise a support constructed to support a patterning device, the patterning device being capable of imparting a radiation beam with a pattern in its cross-section to form a patterned radiation beam. A substrate table constricted to all the substrates may alternatively or additionally be provided. The apparatus may alternatively or additionally be provided with a projection system configured to project the pattern radiation beam onto a target portion of the substrate. The lithographic apparatus may comprise, or be in connection with (e.g., in use, or in general) a radiation source. A radiation source (in isolation, or forming part of or being in connection with a lithographic apparatus) may comprise of a chamber in which radiation may be generated. The chamber may comprise a multilayer mirror as described above, for example in the form of a grating or as a reflective surface without a grating structure. To protect the multilayer mirror from hydrogen particles, the multilayer mirror may be provided with protective layer on the stack of layers which is not shown in the drawings. Such a protective layer may comprise silicon nitride, ruthenium or molybdenum.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multilayer IC, so that the term substrate used herein may also refer to a substrate that already contains multiple processed layers.

The term "lens," where the context allows, may refer to any one or combination of various types of optical components, including refractive, reflective, magnetic, electromagnetic, and electrostatic optical components.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different from those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A multilayer mirror comprising:
   a layer of a first material;
   a layer of silicon;
   the layer of the first material and the layer of silicon forming a stack of layers;
   wherein only an exposed region of the layer of silicon comprises a modification that is arranged to improve robustness of the exposed region of the layer of the silicon.

2. The multilayer mirror of claim 1, wherein the modification is arranged to improve the robustness of the exposed region of the layer of the silicon by at least one of:
   reducing a reactivity of the exposed region of the layer of silicon with hydrogen or atomic hydrogen; and
   improving a sputtering resistance of the exposed region of the layer of silicon.

3. The multilayer mirror of claim 2, wherein the reactivity of the exposed region of the layer of silicon with hydrogen or atomic hydrogen is reduced by at least one of:
   one or more implanted materials provided on a surface of the exposed region of the layer of silicon, or within the exposed region of the layer of silicon; and
   a passivation layer covering, or forming part of, the exposed region of the layer of silicon.

4. The multilayer mirror of claim 2, wherein the sputtering resistance of the exposed region of the layer of silicon is improved by at least one of:
   one or more implanted materials provided on a surface of the exposed region of the layer of silicon, or within the exposed region of the layer of silicon; and
   a passivation layer covering, or forming part of, the exposed region of the layer of silicon.

5. The multilayer mirror of claim 1, wherein the modification comprises at least one of:
   one or more implanted materials comprising at least one of boron, nitrogen and nitride, provided on a surface of the exposed region of the layer of silicon, or within the exposed region of the layer of silicon; and
   a passivation layer covering, or forming part of the exposed region of the layer of silicon.

6. The multilayer mirror of claim 5, wherein the passivation layer comprises one or more of a nitride layer, a silicon nitride layer, a boron glass layer, or a silicon oxynitride layer.

7. The multilayer mirror of claim 1, wherein the exposed region of the layer of silicon is a peripheral region of the layer of silicon or a sidewall of the layer of silicon.

8. The multilayer mirror of claim 1, wherein:
   the multilayer mirror comprises at least one of a plurality of layers of the first material and a plurality of layers of silicon, such that:
   the plurality of layers of silicon are separated by a layer of the first material, or
   the plurality of layers of the first material are separated by a layer of silicon.

9. The multilayer mirror of claim 1, wherein a plurality of exposed regions of the layer or layers of silicon comprises the modification.

10. The multilayer mirror of claim 1, wherein a majority or substantially all of the exposed region or regions of the layer or layers of silicon comprise the modification.

11. A lithographic apparatus comprising:
    an illumination system configured to generated a beam of radiation;
    a patterning device configured to modulate the beam;
    a projection system configured to direct the modulated beam onto a target portion of a substrate; and
    multilayer mirror within one of the illumination or projection system, the multilayer mirror comprising:
    a layer of a first material;
    a layer of silicon;
    the layer of the first material and the layer of silicon forming a stack of layers;
    wherein only an exposed region of the layer of silicon comprises a modification that is arranged to improve robustness of the exposed region of the layer of the silicon.

12. A method comprising:
    forming a stack of layers including a layer of a first material and a layer of silicon; and
    modifying only an exposed region of the layer of silicon to improve robustness of the exposed region of silicon.

13. The method of claim 12, wherein the modifying comprises:
    reducing a reactivity of the exposed region of the layer of silicon with hydrogen or atomic hydrogen; or improving a sputtering resistance of the exposed region of the layer of silicon.

14. The method of claim 13, wherein the reactivity of the exposed region of the layer of silicon with hydrogen or atomic hydrogen is reduced by at least one of:
    implanting one or more material on a surface of the exposed region of the layer of silicon, or within the exposed region of the layer of silicon; and
    providing a passivation layer that covers, or forms part of, the exposed region of the layer of silicon.

15. The multilayer mirror of claim 13, wherein the sputtering resistance of the exposed region of the layer of silicon is improved by at least one of:
    implanting one or more material on a surface of the exposed region of the layer of silicon, or within the exposed region of the layer of silicon; and
    providing a passivation layer that covers, or forms part of, the exposed region of the layer of silicon.

16. The method of claim 12, wherein modifying comprises at least one of:
    implanting one or more material on a surface of the exposed region of the layer of silicon, or within the exposed region of the layer of silicon; and
    providing a passivation layer that covers, or forms part of, the exposed region of the layer of silicon.

* * * * *